United States Patent [19] [11] 4,376,987
Hsia [45] Mar. 15, 1983

[54] THRESHOLD REFERENCED MNOS SENSE AMPLIFIER

[75] Inventor: Yukun Hsia, Santa Ana, Calif.

[73] Assignee: McDonnell Douglas Corporation, Long Beach, Calif.

[21] Appl. No.: 178,834

[22] Filed: Aug. 18, 1980

[51] Int. Cl.³ .................... G11C 7/00; G11C 11/40
[52] U.S. Cl. .................................. 365/184; 365/186; 365/205; 365/210
[58] Field of Search ............... 365/182, 184, 186, 205, 365/207, 208, 210

[56] References Cited

U.S. PATENT DOCUMENTS 4,094,008 6/1978 Lockwood et al. ................ 365/210

Primary Examiner—George G. Stellar
Attorney, Agent, or Firm—Gregory A. Cone; Walter J. Jason; Donald L. Royer

[57] ABSTRACT

An MNOS nonvolatile memory array employing single-element-per-bit storage and two-element-per-bit sensing utilizing a threshold referenced sense amplifier is organized such that the two legs of the sensing circuit are in substantial electrical balance during sensing.

24 Claims, 7 Drawing Figures

THRESHOLD REFERENCED MNOS SENSE AMPLIFIER

BACKGROUND OF THE INVENTION

1. Field of the Invention

This invention relates to nonvolatile MNOS transistor memory arrays employing single-element-per-bit storage and two-element-per-bit sensing.

2. Description of the Prior Art

As their development has progressed over the last several years, MNOS devices have seen increased use in the design and fabrication of memory arrays. The MNOS device is particularly desirable because of its nonvolatility; that is, the information written into the device is retained even in a power-off state. An MNOS device normally will take the form of a standard insulated gate field effect transistor structure in which the silicon dioxide gate insulator is replaced by a double insulator, typically a layer of silicon dioxide nearest the silicon substrate and a layer of silicon nitride over the silicon dioxide. The "memory" of the device is associated with the existence of traps at or near the silicon dioxide-silicon nitride interface, the threshold voltage of the insulator-gate field effect transistor being influenced by the charged state of the traps. These traps are conveniently charged and discharged by the application of a sufficiently large voltage of suitable effective polarity to the gate electrode. The MNOS memory device can then be assigned a high or low logic level dependent upon the written threshold voltage level.

Although the MNOS device can be correctly deemed as nonvolatile, repeated interrogation of the device can, after a large number of such interrogations, cause deterioration of the performance of the device, necessitating a "refresh" pulse to the gate of the device. The information content of the MNOS device is accessed by a sense circuit which includes the interrogation step mentioned above. The design of the sense circuit directly affects the storage density of the larger MNOS memory array. Although a single-element-per-bit storage configuration is highly desirable, two-element-per-bit storage configurations are prevalent. Apparently the absence of a commercially available single-element-per-bit storage memory array is due to the lack of a suitable sense amplifier circuit, thereby forcing the use of the bulkier two-element-per-bit configurations.

SUMMARY OF THE INVENTION

In accordance with the present invention, a novel threshold referenced MNOS sense amplifier circuit is provided, organized in a two-element-per-bit sensing configuration while retaining the economical single-element-per-bit storage configuration for the larger MNOS memory array, wherein the sensing circuit comprises an MNOS device capable of being set to a high or a low threshold voltage; a reference MOSFET having a threshold voltage intermediate to the high and low threshold voltages of the MNOS; an interrogation means coupled in to the gate of the MNOS, a bias MOSFET at the gate of the referenced MOSFET, said means being capable of supplying a tracking interrogation voltage to the reference MOSFET; and a resettable bistable latch coupled to the MNOS and the reference MOSFET. This sensing circuit finds an application within an MNOS memory array which is designed such that it provides for single-element-per-bit storage with two-element-per-bit sensing, electrically balanced columns of reference and memory transistors (the two "legs" of the sensing latch circuit), physical symmetry with a space-efficient topology, and flexibility in the data sensing and control circuit operations.

DETAILED DESCRIPTION OF THE INVENTION

The metal nitride oxide semiconductor field effect transistor (MNOS) is extremely useful as a nonvolatile memory device. The information content of the MNOS device is given by the threshold voltage of the device which is, in turn, electrically alterable by the application of a suitable voltage to the gate electrode of the MNOS device. Information within the device is obtained by a sense amplifier circuit which "reads" the information content of the memory device depending upon the presence of a low threshold or a high threshold voltage within the MNOS. It is desirable to interrogate the MNOS device with voltages either at or only slightly above the low threshold voltage level of the MNOS device in order to maintain the integrity of the low threshold voltage level of the MNOS device.

In brief, the sense amplifier circuit described in detail in the disclosure below utilizes both the object MNOS memory device QN and a reference transistor QR in its operation. If the MNOS device has been set to a low threshold voltage, the interrogation pulse will cause the MNOS transistor to conduct. However, if the MNOS transistor has been set to a high threshold voltage, the interrogation pulse will not be sufficient to cause the MNOS transistor to conduct, but will be sufficient to cause conductance in the reference transistor QR. Therefore, the interrogation pulse will produce an output from the MNOS transistor if the MNOS transistor has been set to a low threshold voltage and will produce an output from the reference transistor QR if the MNOS transistor has been set to a high threshold voltage. Since both QR and QN are subject to the same interrogation pulse, the circuit is said to be "self tracking."

If the presence of a low threshold voltage level within the MNOS transistor were to correspond to a logic "zero" state and the presence of a high voltage threshold would correspond to a logic "one" state, then, as a result of the interrogation pulse, an output from the MNOS transistor would represent a logic "zero," while an output from the reference transistor QR would represent a logic "one." This represents the basic principle of two-element-per-bit sensing with QN being one element and QR being the second element. These two outputs are then coupled to a resettable bistable latch along with other circuit means to form the threshold referenced MNOS sense amplifier circuit.

Figure 1:
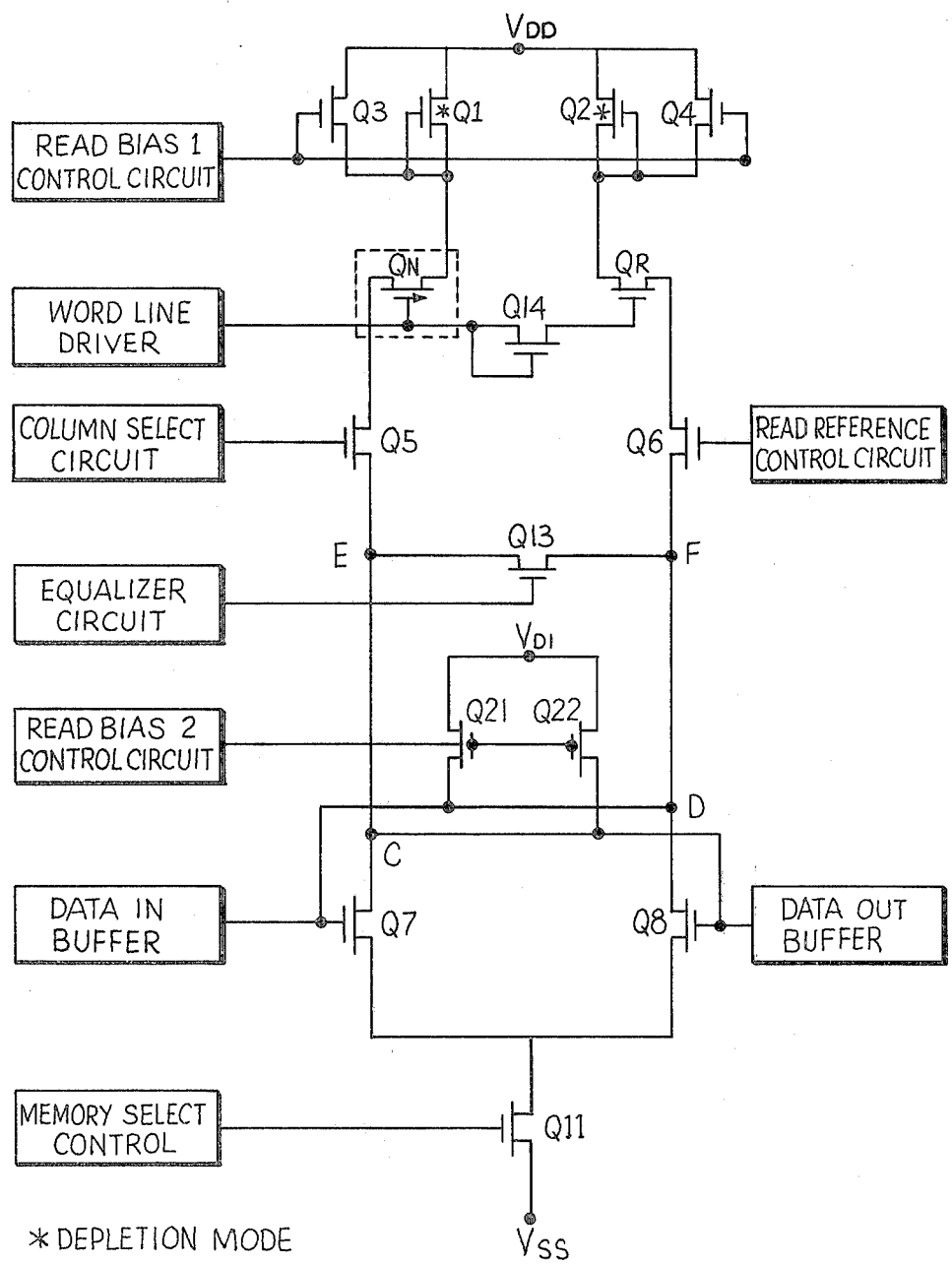
FIG. 1 is a schematic diagram of the threshold referenced MNOS sense amplifier circuit.

Although other variations are possible to one skilled in the art, the threshold referenced MNOS sense amplifier circuit will be described herein within the context of a larger MNOS memory array circuit. FIG. 1 is a simplified schematic of the sense amplifier circuit shown as applied to a single MNOS transistor memory device QN. As illustrated, a split gate MNOS is assumed. $V_{zero}$ ($V_0$) and $V_{one}$ ($V_1$) are the two possible threshold states of the MNOS transistor. $V_R$ represents the reference voltage value at which QR conducts. The zero state overdrive ($V_R - V_0$) is provided by the threshold and back gate effect voltage drop of the resistive load bias transistor Q14.

If QN has previously been set to the low ($V_0$) threshold state, QN begins to conduct as the word line is driven to a voltage higher than $V_0$ and turns on the transistor Q8. This serves to set the bistable latch at node D at $V_{SS}$ and node C at $V_{D1}$. Conversely, if QN has previously been set at the high threshold state ($V_1$), QR will begin to conduct first, thereby turning on Q7. For this condition the latch will be set with node C at $V_{SS}$ and node D at $V_{D1}$. Therefore, if node C of the bistable latch is tagged as the output of the sense amplifier circuit, the output of the sense amplifier will correspond to the previously set logic state of the MNOS memory transistor QN. Typical approximate voltage values for these circuits are $V_{DD}=25$ v, $V_{D1}=10$ v, and $V_{SS}=$ ground.

Figure 2:
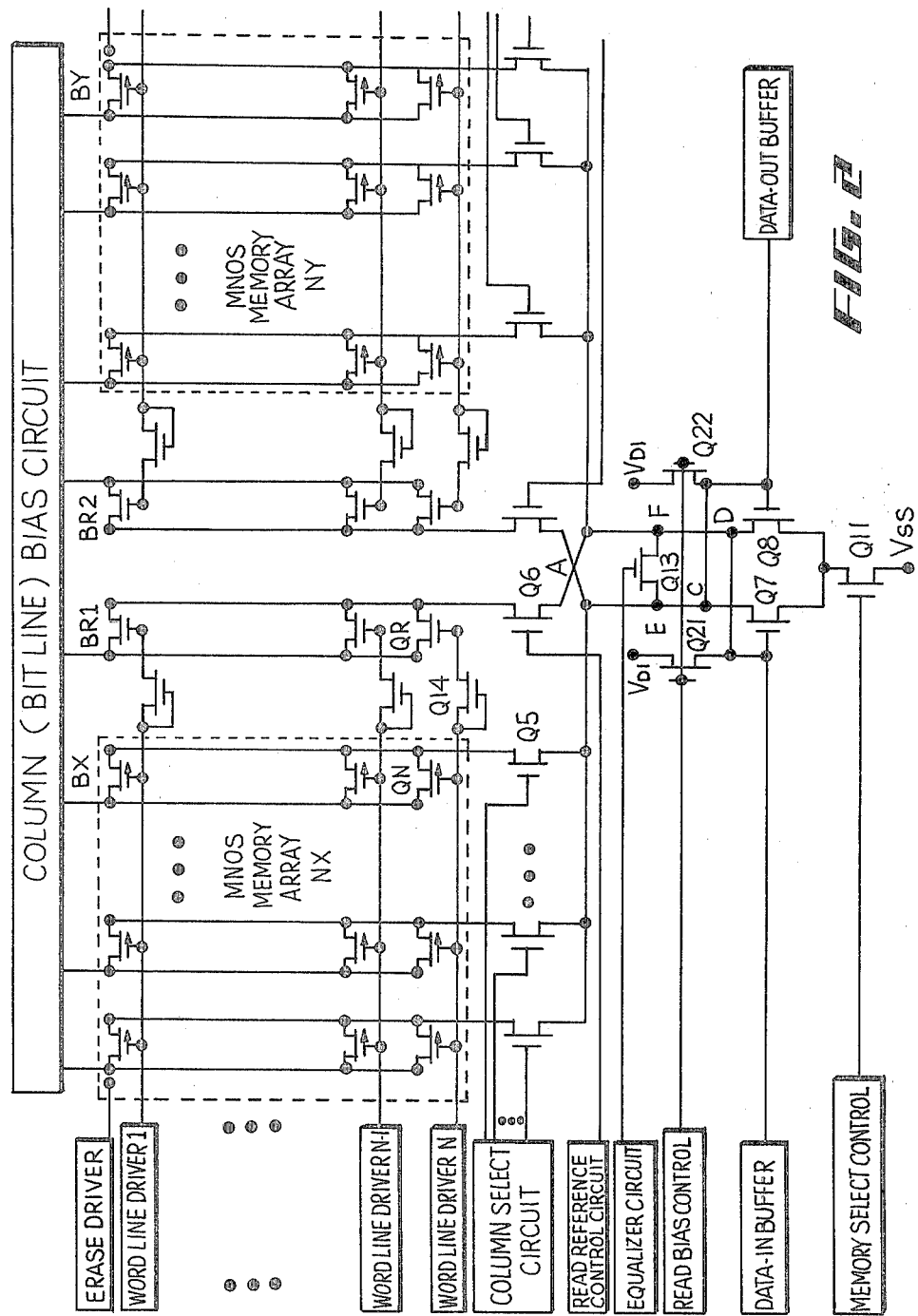
FIG. 2 is a schematic diagram of the circuit of FIG. 1 implemented within a larger MNOS memory array.

FIG. 2 illustrates the application of the threshold referenced MNOS sense amplifier to an MNOS memory array. The array configuration of FIG. 2 illustrates the single-element-per-bit storage structure. This can be compared with prior art devices with two-elements-per-bit storage wherein two MNOS memory devices are required for each bit line. In the configuration illustrated in FIG. 2, the MNOS storage transistors are arranged in two equal arrays organized with N lines by X columns in one array, NX, and N lines by Y columns in array, NY, with X equal to Y. To achieve balanced electrical loading of both legs of the sense amplifier circuit, two reference transistor columns are used, BR1 with the array NX and BR2 with the array NY.

The reference transistors QR are redundantly set in columns BR1 and BR2 in order to: achieve bit line resistance and capacitance loading balance with the memory bit line in the array; provide tracking of the word line driver voltage during sensing between the storage transistor QN and the reference transistor QR with the use of the same word line driver (for example, word line driver N); provide for back gate bias compensation during the readout of both the selected bit column (for example, column BX) and reference transistor column BR1; and provide for composite symmetry to achieve physical topological balance. It is also noted that the two reference transistor columns BR1 and BR2 have a crossover at node A. There is no electrical interconnection at node A, and this crossover is utilized for the purpose of saving space within the memory array. This crossover can be accomplished with a single metalization of the chip if the lower of the two conductors at A is produced by a diffusion step. An alternative configuration without a crossover is, of course, possible, but would require additional space.

Referring still to FIG. 2, the column bias circuits provide independent bias current to each of the bit lines (columns) and to the reference transistor columns BR1 and BR2. Referring again to FIG. 1, Q2, a resistive load depletion mode MOSFET, and Q4 constitute the bias circuits for the reference transistor column BR1 of FIG. 2. Similarly Q1, a depletion resistive load mode MOSFET, and Q3 constitute the bias transistors of an individual column of MNOS transistors within the memory array. The READ BIAS ONE CONTROL CIRCUIT turns on Q3 and Q4 during the READ cycle of operation to provide additional bias current in order to increase the speed of the sense amplifier circuit. The WORD LINE DRIVER clamps the word line to $V_{SS}$ during ERASE, supplies the write voltage ($V_W$ which equals $V_{DD}$) during WRITE, and also provides the read voltage ($V_R$) for READ interrogation of the stored data within the individual MNOS storage transistor QN. The COLUMN SELECT CIRCUIT provides decoding for selection of the bit line column to be coupled to the sense amplifier circuit and, at the same time, isolates the other bit lines in the storage array during both the WRITE and READ operations.

The READ REFERENCE CONTROL CIRCUIT couples the corresponding reference transistor column, BR1 or BR2, to the sense amplifier latch circuit during the READ interrogation. The EQUALIZER CIRCUIT provides the basic reset function to the sense amplifier latch. Prior to the READ step, it equalizes the voltages at nodes C and D to a value just below that needed to set up the latch circuit. The READ BIAS 2 CONTROL CIRCUIT turns on Q21 and Q22 after the latch is set up during READ to hold the latch for data output. The bias thereby established eliminates the requirement to maintain the word line at $V_R$. After setting up the latch, the word line driver is turned off to minimize the READ disturb (interrogation) of the MNOS memory transistor QN. Q5 and Q6 will normally be turned off in order to prepare the column select circuit for the next decode access operation. The DATA IN BUFFER is usually set at high impedance except during WRITE. During the WRITE step, depending on whether the input data is a logic one or a logic zero, Q7 is either turned on with node C set to $V_{SS}$ or is turned off with node C being pulled to $V_{DD}$ (forcing QN to an "inhibit WRITE" mode).

During the READ step, the DATA OUT BUFFER gates out the sense amplifier output at node C. The input to the DATA OUT BUFFER control circuit will normally be at a high impedance. The MEMORY SELECT CONTROL provides a single point at which the current path to $V_{SS}$ can be cut off in the array and sense circuit network in order that other control functions, such as standby or chip select modes, can be implemented in an integrated circuit memory device. This control circuit is very useful in controlling and minimizing the power consumption of the circuit. It should be noted that in FIG. 2 corresponding sets of word line drivers, column select circuits, and read reference control circuits are needed for the MNOS memory array NY. The arrays NY and NX constitute two NX bits of storage serviced by the single sense amplifier circuit.

TIMING AND CIRCUIT OPERATIONS

Based on the circuit topology as illustrated in FIG. 2, five modes of circuit operation are feasible. In the READY operation, timing operations, not shown, all of the peripheral controls are set at zero, and the memory select control turns on power to the circuit by turning on Q11.

Figure 3:
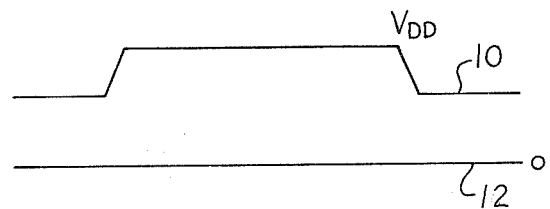
FIGS. 3, 4, 5, 6, and 7 show various time-voltage relationships for different operations utilizing the threshold referenced MNOS sense amplifier circuit.

In the BLOCK ERASE, all bit columns are unselected, all word line drivers are at $V_{SS}$, and the ERASE DRIVER pulls the isolated array substrate tub to $V_{DD}$. This operation is illustrated in FIG. 3 with the ERASE DRIVER circuit 10 being set as shown and all other control circuits 12 being held at zero voltage level.

Figure 4:
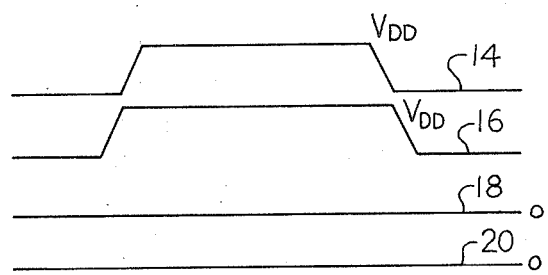

For SINGLE WORD ERASE operation, all of the bit columns are unselected, all the word line drivers are at $V_{DD}$ except for the selected word line which is driven to $V_{SS}$. The ERASE driver pulls the isolated array substrate tub to $V_{DD}$. This operation is illustrated in FIG. 4. The ERASE DRIVER 14 and unselected word lines 16 are held at $V_{DD}$ while the selected word line 18 is driven to $V_{SS}$ (zero). The memory select control circuit not shown is held at $V_{D1}$ while the other control circuits 20 are inactive.

Figure 5:
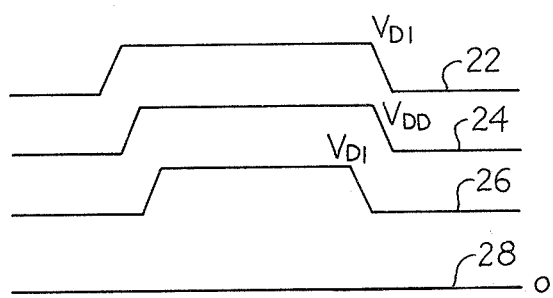

In the WRITE "1" operation, a single bit is written to a logic one level. The DATA IN BUFFER turns on Q7, thereby setting node C at $V_{SS}$. The corresponding (selected) word line is driven to $V_{DD}$. The COLUMN SELECT CIRCUIT turns on the column isolation transistor QS of the corresponding (selected) bit column. The MNOS memory transistor QN at the selectd word line and bit column is written to a high threshold state (logic "one" level) with the unselected column lines being placed in an inhibit write state during this operation. The timing of the various operations within the WRITE "1" operation as illustrated in FIG. 5. The DATA IN BUFFER 22, the selected word line 24, and the column select circuit 26 are actuated as indicated while the other control circuits 28 are held at a zero voltage level during this operation except for the memory select circuit, not shown, which is held at $V_{D1}$.

Figure 6:
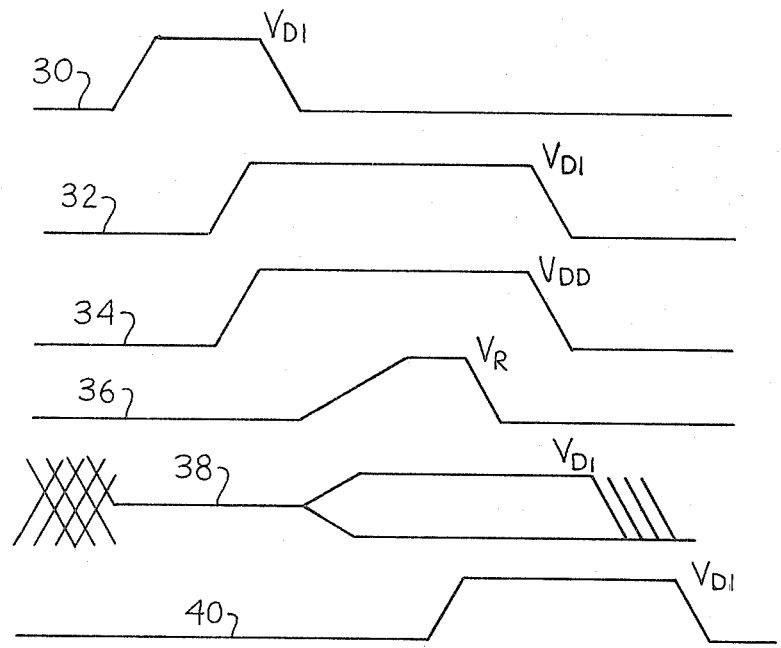

At least two different READ operations can be utilized for the topology disclosed in this invention. One such approach utilizes a current sensing scheme and is illustrated in FIG. 6. In this scheme, the EQUALIZER CIRCUIT 30 first turns on Q13 to equalize the voltages at nodes C and D (Q13 resets the sense amplifier bistable latch). READ BIAS 1 CONTROL CIRCUIT 34 is then turned on. Both the COLUMN SELECT CIRCUIT and the READ-REFERENCE CONTROL CIRCUIT 32 act to turn on the column isolation transistors of the selected bit column and the reference transistor column. Q13 is then turned off as the selected word line 36 is ramped to $V_R$ for the threshold interrogation of QN and QR. This ramped interrogation voltage serves to minimize read disturb to a low threshold voltage present in QN. Repeated exposure to an interrogation voltage level of $V_R$ will, in time, cause $V_O$ to rise to $V_R$. By minimizing the time during which the read interrogation pulse is at the $V_R$ level, the ramped pulse maximizes the integrity of the $V_O$ state of QN. If QN was previously written with a high threshold (logic "one" level), QR will charge node D toward $V_R$ and will turn on Q7, resulting in a $V_{SS}$ voltage value at node C, 38. Conversely, if QN had previously been written with a low threshold (logic "zero" level), node C would be pulled towards $V_R$, and a logic "zero" output would result. After the voltage at node C is established, the sense amplifier bistable latch is now set and the READ BIAS 2 CONTROL CIRCUIT 40 TURNS on Q21 and Q22 to maintain bias currents for the latch circuit as $V_R$ is removed from the selected word line to minimize read disturb of QN. The DATA OUT BUFFER outputs the data at node C.

Figure 7:
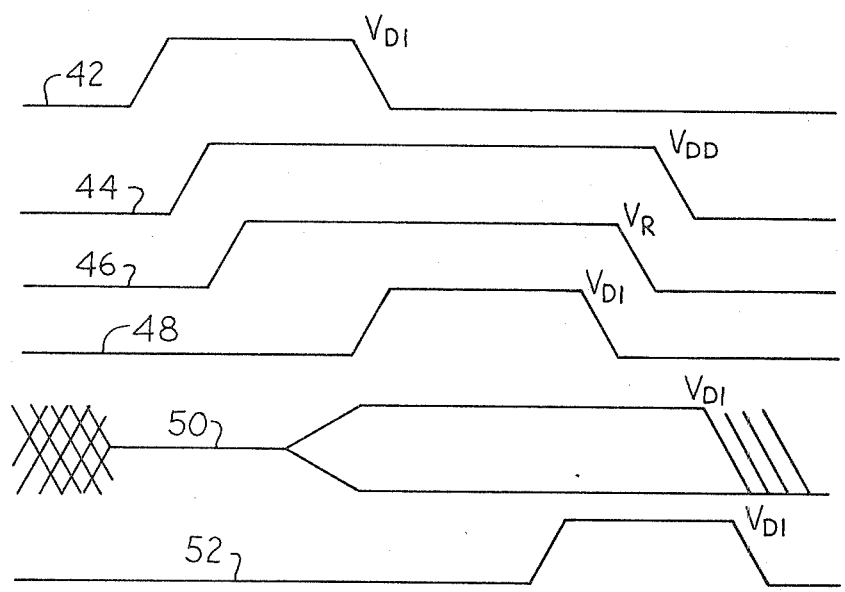

An alternative READ operation is possible by using a voltage sensing scheme. This approach is illustrated in FIG. 7. The EQUALIZER CIRCUIT turns on Q13 to reset the sense amplifier latch as above. READ BIAS ONE CONTROL CIRCUIT 44 and selected word line circuits 46 are also turned on as indicated. By the action of the read interrogate voltage at the word line, the voltages at nodes E and F, as shown in FIGS. 1 and 2 ($V_E$ and $V_F$ respectively), are established. If QN had been set to the low threshold state (logic "zero" level), $V_E$ is greater than $V_F$; and, conversely, if QN had been set to the high threshold level (logic "one" level), $V_E$ is less than $V_F$. The column select circuit and read reference control circuits 48 are then turned on to engage the nodes E and F to the latch circuit for sensing. After the voltage at node C is established, the sense amplifier bistable latch set, READ BIAS 2 CONTROL CIRCUIT 52 turns on Q21 and Q22 to maintain bias current for the latch current as $V_R$ is removed from the selected word line. This alternate technique relies less on the electrical balance of the two legs of the sensor to ensure proper data sensing. Instead, it relies only on the proper timing of the control circuit. However, sensing speed is reduced and the redisturb on QN cannot be readily minimized by the read voltage ramping technique in the prior approach.

It should also be noted that an automatic "refresh" operation can be readily accomplished if during the "READ" operation, after the sense circuit is latched with data, the wordline is further ramped to the writing voltage level ($V_{DD}$) by the wordline driver control circuit. This automatic means of refresh for the MNOS devices is an integral part of the circuit type topology of this invention. Other means of accomplishing refresh of MNOS nonvolatile storage devices require more complex means of circuit hardware and/or sequencing of memory operations to effect a separate "WRITE" operation to the devices to be refreshed.

Although the use of the threshold reference MNOS sense amplifier circuit has been described in detail within the larger context of an MNOS memory array, the use of the sense amplifier circuit is not so limited. Other applications include single bit nonvolatile switches, serial shift register memories, and MNOS associative memory arrays. These and other uses of this sense amplifier circuit can be readily implemented by one of ordinary skill in the art.

Employment of the threshold referenced MNOS sense amplifier circuit within the larger MNOS memory array shown in FIG. 2 has several advantages. The large MNOS nonvolatile semiconductor memory transistor array can be based on single-device-per-bit storage but two-device-per-bit sensing. The balanced circuit topology results in electrical balance between the two "legs" of the sensing latch circuit without the need to utilize compensating dummy composite features in the array. Electrical balance is achieved between a column of reference transistors (here either BR1 or BR2) and the particular MNOS memory array column containing the MNOS device containing the desired stored information, thereby enabling tracking of read interrogate voltage, bit line resistance and capacitance, and back gate effects to be achieved concurrently. The column isolation transistors Q5 which serve to isolate a particular MNOS memory array column during a control operation are also concurrently utilized for column decoding to achieve random access of both READ and WRITE ONE to a single bit of the transistor array. A single word erase operation is also possible with this circuit topology.

Since two-device-per-bit sensing is used, self refresh of data is also possible with the same circuit, thereby extending the nonvolatility of the memory device; and, finally, using the same circuit topology, either current sensing or voltage sensing can be implemented, depending upon the design requirements of the peripheral control circuitry.

I claim:

1. In a transistor memory array disposed in bit line columns and word line rows comprising metal nitride oxide semiconductor field effect transistors (MNOS) wherein the organization of the array is such that the array comprises means for single-element-per-bit storage and two-element-per-bit sensing wherein the sensing means compares a threshold voltage of a single MNOS contained within an MNOS bit line column of the memory array to the threshold voltage of a single reference transistor contained within a column of such reference transistors wherein the MNOS column and the reference transistor column are substantially in electrical balance during the operation of the sensing means, wherein each MNOS bit line column is connected to the sensing means by a separate decoding means wherein the decoding means effectively isolates the column from the remainder of the array and where that portion of the array underlaying the MNOS transistors is underlain by an isolation tub connected to a control circuit,
   a method of operating the array wherein the threshold voltage levels of all of the MNOS devices within the array are set to one threshold voltage level simultaneously.

2. In a transistor memory array disposed in bit line columns and wordline rows comprising metal nitride oxide semiconductor field effect transistors (MNOS) wherein the organization of the array is such that the array comprises means for single-element-per-bit storage and two-element-per-bit sensing wherein the sensing means compares a threshold voltage of a single MNOS contained within an MNOS bit line column of the memory array to the threshold voltage of a single reference transistor contained within a column of such reference transistors wherein the MNOS column and the reference transistor column are substantially in electrical balance during the operation of the sensing means, wherein each MNOS bit line column is connected to the sensing means by a separate decoding means wherein the decoding means effectively isolates the column from the remainder of the array and where that portion of the array underlaying the MNOS transistors is underlain by an isolation tub connected to a control circuit,
   a method of operating the array wherein the threshold voltage level of at least one of the MNOS transistors in a single word line row is changed from one state to another state.

3. In a transistor memory array disposed in bit line columns and wordline rows comprising metal nitride oxide semiconductor field effect transistors (MNOS) wherein the organization of the array is such that the array comprises means for single-element-per-bit storage and two-element-per-bit sensing wherein the sensing means compares a property of a single MNOS contained within an MNOS bit line column of the memory array to the same property of a single reference transistor contained within a column of such reference transistors wherein the MNOS column and the reference transistor column are substantially in electrical balance during the operation of the sensing means,
   a method of operating the array wherein the sensing means utilizes a ramped interrogation voltage pulse in its comparison of the threshold voltage of the MNOS device and the threshold voltage of the reference transistor wherein a substantial portion of the pulse has a voltage level below that of the threshold voltage of the reference transistor.

4. The method of claim 3 wherein the sensing means of the array comprises a bistable latch wherein the threshold voltage level of the MNOS device is refreshed after the latch is set up.

5. In a transistor memory array disposed in bit line columns and word line rows comprising metal nitride oxide semiconductor field effect transistors (MNOS), the improvement comprising:
   an organization of the array such that the array comprises means for single-element-per-bit storage and two-element-per-bit sensing wherein the sensing means compares a property of a single MNOS transistor in an MNOS bit line column of the array to the same property of a single reference transistor contained within a column of such reference transistors wherein the MNOS column and the reference transistor column are substantially in electrical balance during the operation of the sensing means,
   wherein the array is organized into two sub-arrays, the two sub-arrays having an equal number of MNOS bit line columns and each sub-array having one reference MOS column, the array being symmetric about a central axis with the two MOS reference columns disposed closest to the axis.

6. The array of claim 5 wherein the sensing means comprises a threshold referenced sense amplifier comprising a bistable latch.

7. The array of claim 6 wherein the sensing means is located at or near the central axis of the array.

8. The array of claim 7 wherein the array is fabricated utilizing a single level metalization integrated circuit process.

9. In a transistor memory array disposed in bit line columns and word line rows comprising metal nitride oxide semiconductor field effect transistors (MNOS), the improvement comprising:
   an organization of the array such that the array comprises means for single-element-per-bit storage and two-element-per-bit sensing wherein the sensing means compares a property of a single MNOS transistor in an MNOS bit line column of the array to the same property of a single reference transistor contained within a column of such reference transistors wherein the MNOS column and the reference transistor column are substantially in electrical balance during the operation of the sensing means,
   wherein each reference transistor column is connected to the sensing means by a separate transistor wherein the drain electrode of the transistor is connected in common to all of the source electrodes of the reference transistors in the column, the source electrode of the transistor is connected to the sensing means, and the gate electrode of the transistor is connected to a control circuit.

10. The array of claim 9 wherein the transistor is an MOS device.

11. In a transistor memory array disposed in bit line columns and word line rows comprising metal nitride oxide semiconductor field effect transistors (MNOS), the improvement comprising:
   an organization of the array such that the array comprises means for single-element-per-bit storage and two-element-per-bit sensing wherein the sensing means compares a property of a single MNOS transistor in an MNOS bit line column of the array to the same property of a single reference transistor contained within a column of such reference transistors wherein the MNOS column and the reference transistor column are substantially in electrical balance during the operation of the sensing means, wherein a word line row comprises a plurality of individual MNOS devices located in a row of the array, the gate electrodes of the MNOS devices being connected in common to a control circuit and further connected in common to the corresponding reference transistor through means which produce an offset condition in the property compared by the sensing means between the MNOS device and the reference transistor.

12. The array of claim 11 wherein the means for producing an offset condition is a resistive load MOS device.

13. A sense amplifier circuit for a metal nitride oxide semiconductor field effect transistor (MNOS) comprising:
an MNOS capable of being set to a high or a low threshold voltage level;
a reference transistor having a threshold voltage intermediate to the high and low threshold voltage levels of the MNOS;
a control circuit means coupled in series to first the gate of the MNOS, second a bias voltage means, and last to the gate of the reference transistor;
and a first transistor coupled in series with the MNOS and a second transistor coupled in series with the reference transistor with the gates of the first and second transistors being cross-coupled so as to form a bistable latch.

14. The circuit of claim 13 wherein the reference transistor, the first transistor, and the second transistor are metal oxide semiconductor field effect transistors (MOS) and the bias voltage means is a resistance load MOS.

15. The circuit of claim 13 wherein the circuit additionally comprises a latch reset means comprising an equalizing transistor wherein the drain electrode of the transistor is connected to one of the latch inputs, the source electrode of the transistor is connected to the other of the latch inputs and the gate electrode of the transistor is connected to a control circuit such that the latch is capable of being reset at high switching speeds.

16. The circuit of claim 13 further comprising two transistors connected between a voltage source and the ouput nodes of the bistable latch such that the data content of the latch may be maintained if the MNOS device is disconnected from the latch.

17. The circuit of claim 13 further comprising a transistor wherein the source electrode of the transistor is connected to a voltage source, the drain of the transistor is connected to the respective source electrodes of the first and second transistors of the bistable latch, and the gate electrode of the transistors is connected to a control circuit such that power may be applied to the sense amplifier circuit.

18. The circuit of claim 13 further comprising a data-in buffer circuit connected to the gate electrode of the first latch transistor.

19. The circuit of claim 13 further comprising a data out buffer circuit, the input of the circuit being connected to the gate of the second latch transistor which is connected to the output node of the latch.

20. The circuit of claim 13 further comprising two resistive load depletion mode MOS transistors wherein the drain electrode of each is connected to a common voltage supply and the gate and source electrodes of one of the transistors are connected to the drain electrode of the MNOS and the gate and source electrodes of the other transistor are connected to the drain electrode of the reference transistor, a third MOS transistor wherein the transistor is connected in parallel with one of the depletion mode MOS transistors and the gate electrode is connected to a control circuit, and a fourth MOS transistor connected in parallel with the other depletion mode MOS transistor wherein the gate electrode is also connected to the control circuit.

21. The circuit of claim 13 further comprising a transistor wherein the drain electrode of the transistor is connected to the output of the reference transistor, the source electrode is connected to the input of the first transistor of the bistable latch, and the gate electrode is connected to a control circuit.

22. The circuit of claim 13 further comprising a transistor wherein the drain electrode is connected to the output of the MNOS, the source electrode is connected to the input of the second transistor of the bistable latch, and the gate electrode is connected to a control circuit.

23. In a sense amplifier circuit for a metal nitride oxide semiconductor field effect transistor (MNOS) comprising:
an MNOS capable of being set to a high or a low threshold voltage level;
a reference transistor having a threshold voltage intermediate to the high and low threshold voltage levels of the MNOS;
a control circuit means coupled in series to first the gate of the MNOS, second a bias voltage means, and last to the gate of the reference transistor;
a first transistor coupled in series with the MNOS and a second transistor coupled in series with the reference transistor with the gates of the first and second transistors being cross-coupled so as to form a bistable latch; and
a method of operating the circuit wherein the control circuit utilizes an interrogation voltage pulse which comprises a ramped voltage pulse wherein a substantial portion of the pulse has a voltage level below that of the threshold voltage of the reference transistor.

24. The method of claim 23 wherein the threshold voltage level of the MNOS device is refreshed after the latch is set up.

* * * * *